(12) United States Patent
Chen et al.

(10) Patent No.: US 12,063,840 B2
(45) Date of Patent: Aug. 13, 2024

(54) DISPLAY PANEL AND DISPLAY DEVICE HAVING FIRST ELECTRODE WITH A PLURALITY OF SUB-ELECTRODES

(71) Applicant: Wuhan China Star Optoelectronics Semiconductor Display Technology Co., Ltd., Wuhan (CN)

(72) Inventors: Tao Chen, Wuhan (CN); Yan Xie, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/284,451

(22) PCT Filed: Dec. 28, 2020

(86) PCT No.: PCT/CN2020/140400
§ 371 (c)(1),
(2) Date: Apr. 10, 2021

(87) PCT Pub. No.: WO2022/095259
PCT Pub. Date: May 12, 2022

(65) Prior Publication Data
US 2023/0329065 A1    Oct. 12, 2023

(30) Foreign Application Priority Data
Nov. 5, 2020    (CN) .......................... 202011224840.8

(51) Int. Cl.
*H10K 59/65*    (2023.01)
*H10K 59/131*    (2023.01)
*H10K 59/35*    (2023.01)

(52) U.S. Cl.
CPC ........... *H10K 59/65* (2023.02); *H10K 59/131* (2023.02); *H10K 59/351* (2023.02); *H10K 59/353* (2023.02)

(58) Field of Classification Search
CPC .... H10K 59/65; H10K 59/353; H10K 59/131; H10K 59/351
See application file for complete search history.

(56) References Cited

U.S. PATENT DOCUMENTS

| 11,367,851 B2 * | 6/2022 | Cai | ...................... H10K 50/813 |
| 2011/0215330 A1 | 9/2011 | Shin | |
| 2021/0202885 A1 * | 7/2021 | Cai | ........................ H10K 59/65 |

FOREIGN PATENT DOCUMENTS

| CN | 108232028 A | 6/2018 |
| CN | 110288945 A | 9/2019 |

(Continued)

OTHER PUBLICATIONS

International Search Report in International application No. PCT/CN2020/140400, mailed on Jul. 27, 2021.

(Continued)

*Primary Examiner* — Lex H Malsawma
(74) *Attorney, Agent, or Firm* — Menachem Nathan; Nathan & Associates

(57) ABSTRACT

A display panel and a display device are provided by the present application. The display panel includes a light-transmitting display region, wherein the light-transmitting display region includes a plurality of pixel units, each of the pixel units includes a first electrode layer and an electrode portion electrically connected to the first electrode layer, and the electrode portion and the first electrode layer constitute a first electrode of the pixel unit; and an orthographic projection of the electrode portion on the first electrode layer is located within a boundary of the first electrode layer.

17 Claims, 11 Drawing Sheets

(56) References Cited

FOREIGN PATENT DOCUMENTS

| | | |
|---|---|---|
| CN | 110491918 A | 11/2019 |
| CN | 110534660 A | 12/2019 |
| CN | 111146362 A | 5/2020 |
| CN | 111312755 A | 6/2020 |

OTHER PUBLICATIONS

Written Opinion of the International Search Authority in International application No. PCT/CN2020/140400, mailed on Jul. 27, 2021.

* cited by examiner

DISPLAY PANEL AND DISPLAY DEVICE HAVING FIRST ELECTRODE WITH A PLURALITY OF SUB-ELECTRODES

FIELD OF INVENTION

The present application relates to the field of display technologies, and particularly relates to a display panel and a display device.

In order to satisfy both imaging effect of cameras and full-screen display design, camera under panel (CUP) technology is applied in display panels, in which a pixel density of a CUP area is less than a pixel density of a display area, so as to improve light transmittance of the CUP area of the display panels. However, process precision may influence pixels in the CUP area, resulting in problems of nonuniform display in the CUP area, etc.

A display panel and a display device are provided by embodiments of the present application, which can improve light transmittance of a display light transmission area while realizing uniform display of the display light transmission area.

SUMMARY OF INVENTION

A display panel is provided by the embodiments of the present application, including a light-transmitting display region and a main display region, wherein the light-transmitting display region includes a plurality of first pixel units, and each of the first pixel units includes: a first electrode layer; and an electrode portion disposed on the first electrode layer and electrically connected to the first electrode layer, wherein the electrode portion and the first electrode layer constitute a first electrode of the first pixel unit; and wherein an orthographic projection of the electrode portion on the first electrode layer is located within a boundary of the first electrode layer.

In some embodiments, the first electrode includes a plurality of sub-electrodes, the first electrode layer includes a plurality of first sub-electrode layers, the electrode portion includes a plurality of first sub-electrode portions each corresponding to one of the plurality of first sub-electrode layers, each of the first sub-electrode layers is connected to the corresponding first sub-electrode portion to constitute one of the sub-electrodes, and an orthographic projection of each of the first sub-electrode portions on the corresponding first sub-electrode layer is located within a first boundary of the first sub-electrode layer. sub-electrode portions on the corresponding first sub-electrode layer is located within a first boundary of the first sub-electrode layer.

In some embodiments, the first electrode layer further includes a plurality of trace portions located among the first sub-electrode layers, and each of the trace portions connects at least two of the sub-electrodes.

In some embodiments, each of the first pixel units includes a plurality of sub-pixels, each of the sub-pixels includes one of the sub-electrodes, wherein the sub-electrodes connected by a same one of the trace portions are located within a same one of the first pixel units, and the sub-pixels connected by a same one of the trace portions emit a same color light.

In some embodiments, the orthographic projection of each of the first sub-electrode portions on the first sub-electrode layer has a second boundary, and a distance between the second boundary and the first boundary of the first sub-electrode layer is greater than or equal to 0.5 microns.

In some embodiments, the distance between the second boundary and the first boundary of the first sub-electrode layer is 0.8 microns.

In some embodiments, each of the first sub-electrode portions includes a reflecting layer located on the first sub-electrode layer and a transparent layer located on the reflecting layer, wherein an orthographic projection of the transparent layer on the first sub-electrode layer is located within the first boundary of the first sub-electrode layer, and an orthographic projection of the reflecting layer on the transparent layer is located within a boundary of the transparent layer.

In some embodiments, a manufacturing material of the first electrode layer is same as a manufacturing material of the transparent layer, the manufacturing material of the first electrode layer includes transparent conductive oxide; and a manufacturing material of the reflecting layer includes one or more of Al, Ag, Ca, Au, and Cu.

In some embodiments, the display panel further includes a transition display area located between the light-transmitting display region and the main display region, and a secondary pixel driving circuit located in the transition display area, and the first electrode layer is electrically connected to the secondary pixel driving circuit.

In some embodiments, the display panel further includes: a first trace layer located under the first electrode layer, wherein the first trace layer is electrically connected to the trace portions; and a second trace layer located under the first trace layer, wherein the second trace layer is electrically connected between the first trace layer and the secondary pixel driving circuit.

In some embodiments, the main display region includes a plurality of second pixel units, each of the second pixel units includes: a first main electrode, a main pixel driving circuit, and a third trace layer electrically connected to the first main electrode and the main pixel driving circuit, and wherein the first main electrode includes the first sub-electrode layers and the electrode portion, and a manufacturing material of the third trace layer is different from a manufacturing material of the first trace layer and a manufacturing material of the second trace layer.

In some embodiments, the manufacturing material of the third trace layer includes metal material, and the manufacturing materials of the first trace layer and the second trace layer include transparent conductive oxide.

In some embodiments, a light transmittance of the third trace layer is less than or equal to a light transmittance of the first trace layer or a light transmittance of the second trace layer.

A display device is also provided by the embodiments of the present application, including anyone of the above-mentioned display panels and a sensor, and the sensor directly faces the light-transmitting display region.

Compared with the prior art, according to the display panel and the display device provided by the embodiments of the present application, wherein the display panel includes a light-transmitting display region and a main display region, wherein the light-transmitting display region includes a plurality of first pixel units, each of the first pixel unit includes: a first electrode layer; and an electrode portion disposed on the first electrode layer and electrically connected to the first electrode layer, and the electrode portion and the first electrode layer constitute a first electrode of the first pixel unit; wherein an orthographic projection of the electrode portion on the first electrode layer is located within a boundary of the first electrode layer, light transmittance of the display light transmission area can be improved while realizing uniform display of the display light transmission area.

DETAILED DESCRIPTION OF EMBODIMENTS

In order to make the objectives, technical solutions and effects of the present disclosure clearer and more definite, the present disclosure will be further described in detail below with reference to the accompanying drawings and in conjunction with embodiments. It should be understood that the specific embodiments described herein are merely for explaining the present application, but is not intended to limit the present application.

Figure 1A:
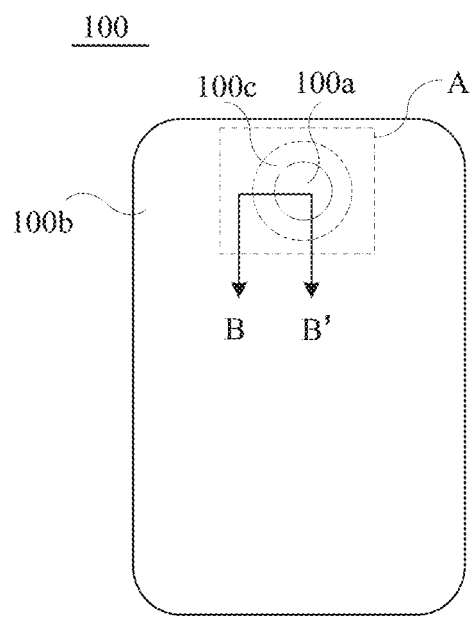
FIG. 1A is a structural schematic diagram of a display panel provided by embodiments of the present application.
Figure 1B:
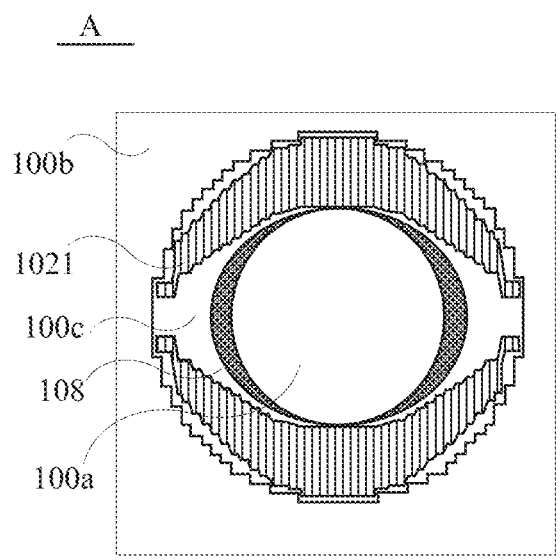
FIG. 1B is a partial enlarged view of portion A in FIG. 1A.

Specifically, please refer to FIG. 1A, FIG. 1A is a structural schematic diagram of a display panel provided by embodiments of the present application;

FIG. 1B is a partial enlarged view of portion A in FIG. 1A.

Figure 1C:
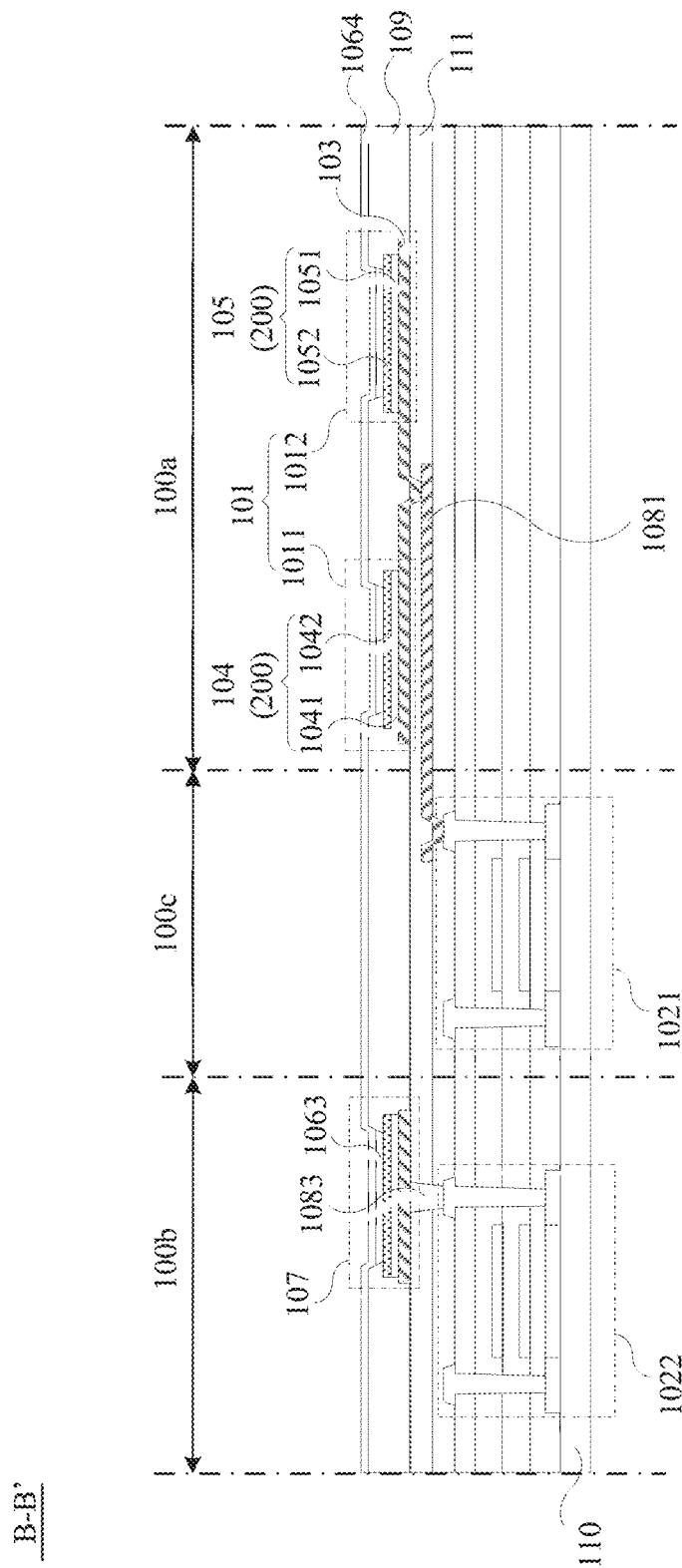
FIG. 1C and FIG. 1D are cross-sectional schematic diagrams showing structures of the display panel along B-B' line in FIG. 1A.
Figure 1D:
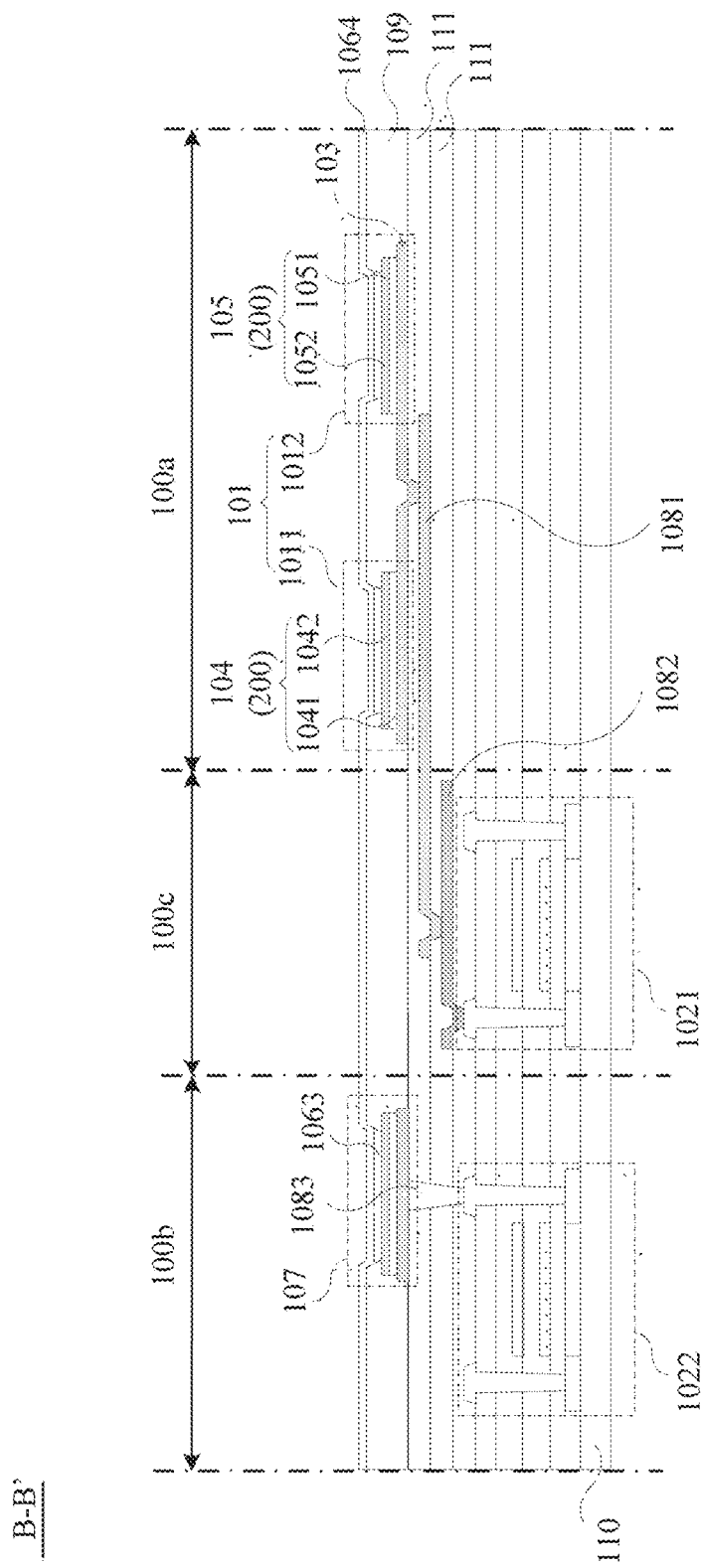

FIG. 1C and FIG. 1D are cross-sectional schematic diagrams showing structures of the display panel along B-B' line in FIG. 1A.

Figure 2A:
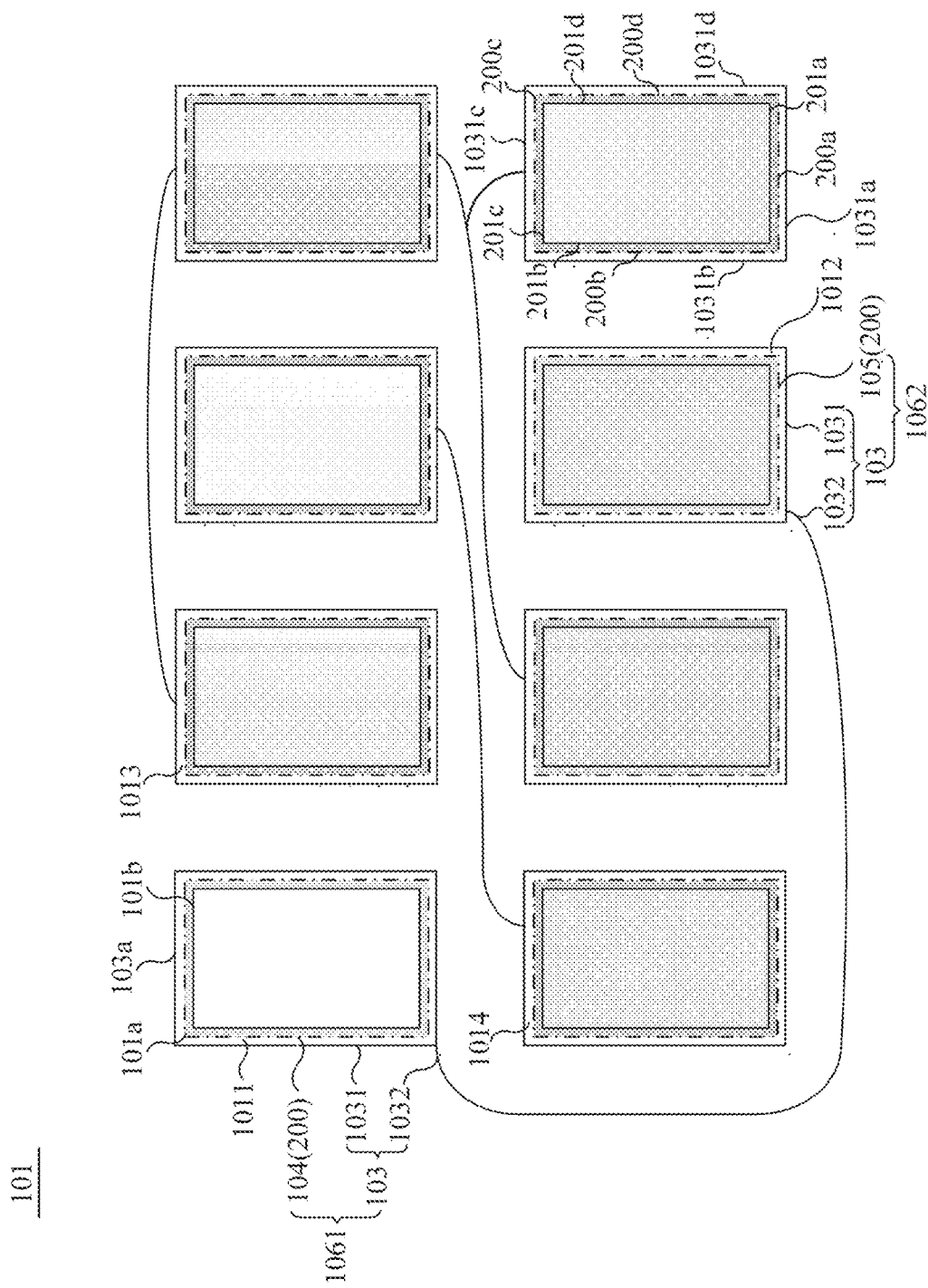
FIG. 2A to FIG. 2C are structural schematic diagrams of sub-pixels provided by embodiments of the present application.
Figure 2B:
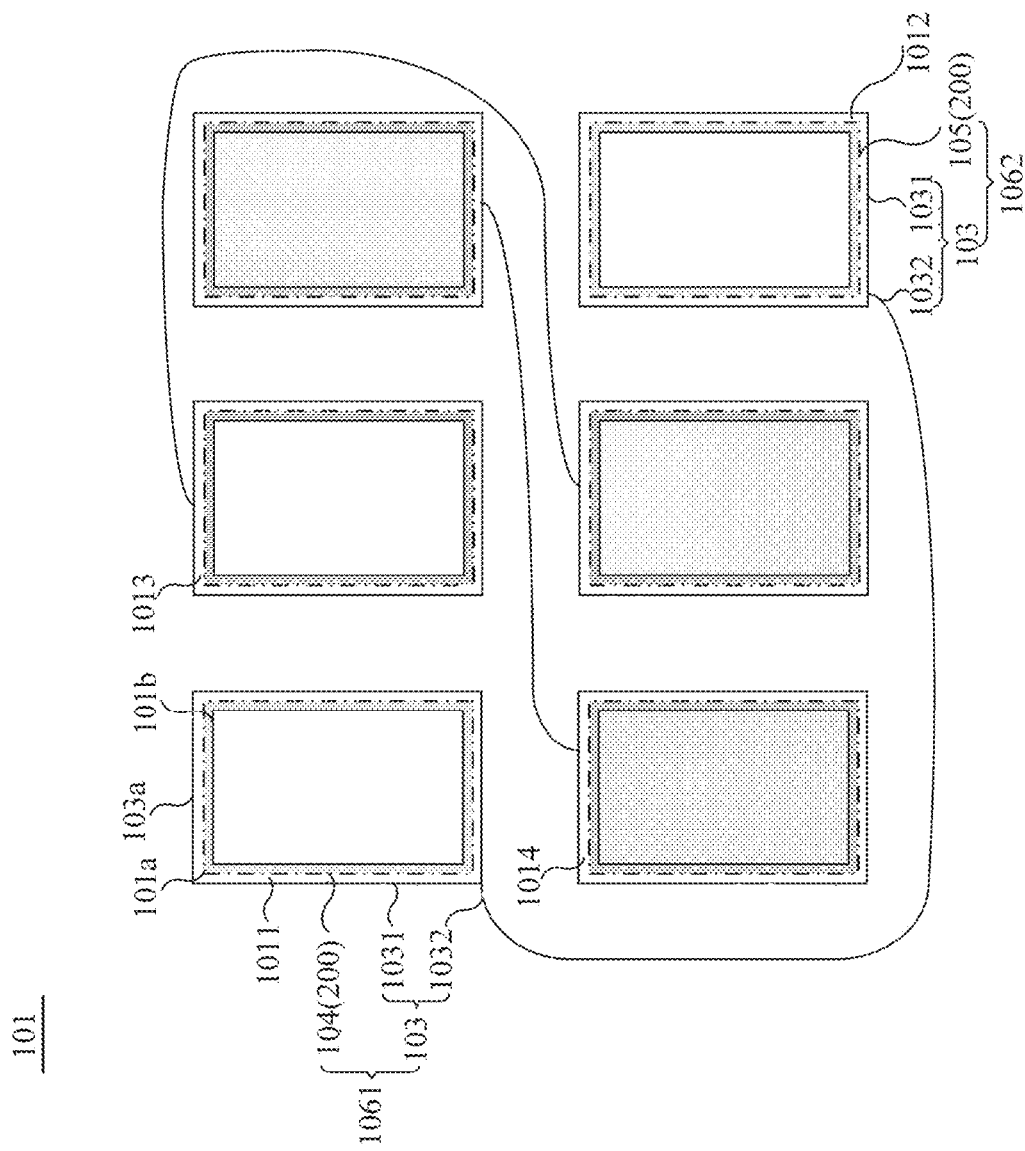
Figure 2C:
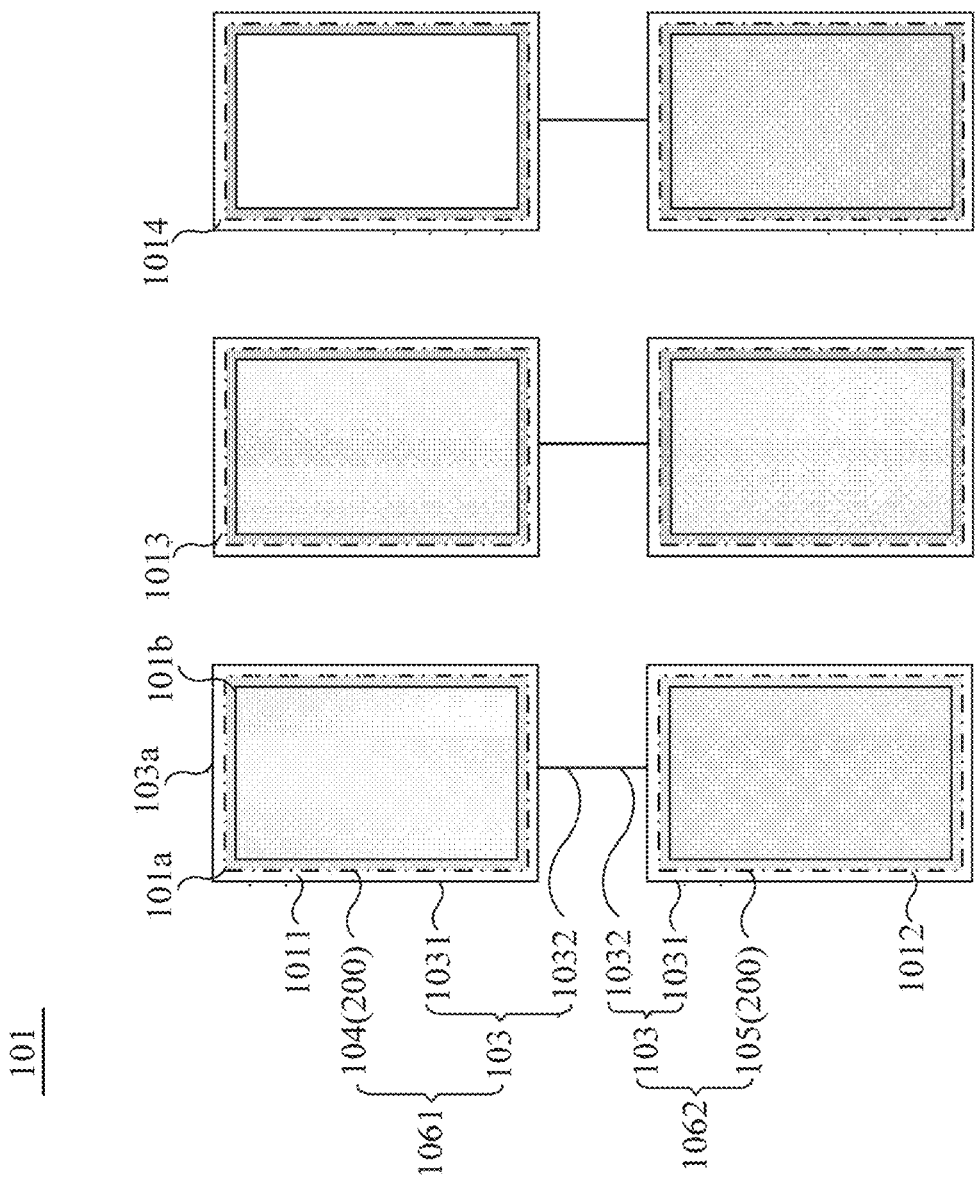

FIG. 2A to FIG. 2C are structural schematic diagrams of sub-pixels provided by embodiments of the present application.

A display panel 100 is provided by the present application, including a light-transmitting display region 100a, a main display region 100b located around the light-transmitting display region 100a, and a transition display area 100c located between the light-transmitting display region 100a and the main display region 100b.

The display panel 100 includes: a plurality of first pixel units located in the light-transmitting display region 100a, wherein each of the first pixel units includes a plurality of sub-pixels 101; a transition area pixel located in the transition display area 100c, and a secondary pixel driving circuit 1021 configured to drive the sub-pixel 101 and the transition area pixel to emit light; and a main sub-pixel 107 located in the main display region 100b and a main pixel driving circuit 1022 configured to drive the main sub-pixel 107 to emit light.

Wherein, each of the first pixel units includes: a first electrode layer 103 electrically connected to the secondary pixel driving circuit 1021; an electrode portion 200 located on the first electrode layer 103 and electrically connected to the first electrode layer 103, the electrode portion 200 and the first electrode layer 103 constitute a first electrode of the first pixel unit, an orthographic projection of the electrode portion 200 on the first electrode layer 103 is located within a boundary of the first electrode layer 103 to improve the light transmittance of the light-transmitting display region 100a, and the structural integrity of the first electrode is ensured with the first electrode layer 103 to realize uniform display of the display panel 100 in the light-transmitting display region 100a.

Furthermore, the first electrode includes a plurality of sub-electrodes; the first electrode layer 103 includes a plurality of first sub-electrode layers 1031, the electrode portion 200 includes a plurality of first sub-electrode portions each corresponding to one of the plurality of first sub-electrode layers 1031, each of the first sub-electrode layers 1031 is electrically connected to the corresponding first sub-electrode portion to constitute one of the sub-electrodes, and an orthographic projection of each of the first sub-electrode portions on the corresponding first sub-electrode layer 1031 is located within a first boundary of the first sub-electrode layer 1031.

Specifically, please refer to FIG. 1C to FIG. 1D and FIG. 2A to FIG. 2C, the plurality of sub-pixels 101 include a first sub-pixel 1011 and a second sub-pixel 1012. The plurality of sub-electrodes includes a first sub-electrode 1061 and a second sub-electrode 1062. Wherein, the first sub-pixel 1011 includes the first sub-electrode 1061. The second sub-pixel 1012 includes the second sub-electrode 1062. The plurality of first sub-electrode portions include a first portion 104 and a second portion 105 disposed at an interval with the first portion 104. The first portion 104 and the second portion 105 are located on the first sub-electrode layer 1031 and are electrically connected to the first sub-electrode layer 1031, respectively. The first portion 104 and the first sub-electrode layer 1031 constitute the first sub-electrode 1061 of the first sub-pixel 1011, and the second portion 105 and the first sub-electrode layer 1031 constitute the second sub-electrode 1062 of the second sub-pixel 1012. Orthographic projections of the first portion 104 and the second portion 105 on the first sub-electrode layer 1031 are located within a first boundary of the first sub-electrode layer 1031 respectively to improve the light transmittance of the light-transmitting display region 100a, and the structural integrity of the first sub-electrode 1061 of the first sub-pixel 1011 and the second sub-electrode 1062 of the second sub-pixel 1012 is ensured with the first sub-electrode layer 1031 to realize uniform display of the display panel 100 in the light-transmitting display region 100a.

Furthermore, the first electrode layer 103 further includes a plurality of trace portions 1032 located among the first sub-electrode layers 1031, and each of the trace portion 1032 connects at least two of the first sub-electrode layers 1031 so that each of the trace portion 1032 can be connected to at least two of the sub-electrodes.

Specifically, please continue referring to FIG. 1C and FIG. 1D and FIG. 2A to FIG. 2C, the first portion 104 and the second portion 105 are located on the first sub-electrode layer 1031 and electrically connected to the first sub-electrode layer 1031, respectively. In the top view, the first portion 104 and the second portion 105 are located within the corresponding first sub-electrode layer 1031. The trace portion 1032 is electrically connected to the first portion 104 and the second portion 105 so that the trace portion 1032 is connected to the first sub-electrode 1061 and the second sub-electrode 1062.

Furthermore, the secondary pixel driving circuit 1021 is electrically connected to the first portion 104 and the second portion 105 through the trace portions 1032 and the first sub-electrode layer 1031 at the same time. Driving current driving the first sub-pixel 1011 and the second sub-pixel 1012 to emit light flows to the first sub-electrode 1061 and the second sub-electrode 1062 through the trace portion 1032, so that the secondary pixel driving circuit 1021 can drive at least two of the sub-pixels 101 to emit light through the first electrode layer 103, thus reducing the number of the secondary pixel driving circuits 1021 and increasing the area of the light-transmitting display region 100a, which is conducive to the improvement of the light transmittance and display quality of the light-transmitting display region 100a.

Furthermore, the at least two of the sub-pixels 101 driven by the secondary pixel driving circuit 1021 emit a same color light. Namely, the plurality of sub-pixels 101 connected by a same one of the trace portions 1032 emit a same color light, so that at least two of the sub-pixels 101 emitting a same color light can be driven by one of the secondary pixel driving circuits 1021, thus reducing the number of the trace portions 1032.

Specifically, please continue referring to FIG. 2A to FIG. 2C, the first sub-pixel 1011 and the second sub-pixel 1012 emit a same color light. The first sub-pixel 1011 and the second sub-pixel 1012 are electrically connected to a same secondary pixel driving circuit 1021 through the first electrode layer 103.

It can be understood that the plurality of sub-pixels 101 located in the light-transmitting display region 100a can be electrically connected to the secondary pixel driving circuit 1021 in a same way as the first sub-pixel 1011 and the second sub-pixel 1012 to reduce the influence on the light transmittance of the light-transmitting display region 100a. Namely, at least two of the sub-pixels in the plurality of sub-pixels 101 located in the light-transmitting display region 100a can be electrically connected to the secondary pixel driving circuit 1021 through the first electrode layer 103, and the at least two of the sub-pixels 101 connected to a same secondary pixel driving circuit 1021 emit a same color light.

Furthermore, the plurality of sub-electrodes connected by a same one of the trace portions 1032 are located in a same one of the first pixel units, so that the plurality of sub-pixels 101 in a same first pixel unit emit light simultaneously under the driving of the secondary pixel driving circuit 1021.

Specifically, as shown in FIG. 2A to FIG. 2C, the plurality of sub-pixels 101 further include a third sub-pixel 1013 and a fourth sub-pixel 1014. Each of the first pixel unit includes the first sub-pixel 1011, the second sub-pixel 1012, the third sub-pixel 1013, and the fourth sub-pixel 1014. If the first sub-pixel 1011 and the second sub-pixel 1012 emit a same color light while the first sub-pixel 1011, the third sub-pixel 1013, and the fourth sub-pixel 1014 emit different color light, then the first sub-pixel 1011 and the second sub-pixel 1012 are electrically connected to a same secondary pixel driving circuit 1021, at least two of the third sub-pixels 1013 are electrically connected to a same secondary pixel driving circuit 1021, and at least two of the fourth sub-pixels 1014 are electrically connected to a same secondary pixel driving circuit 1021. If the first sub-pixel 1011 and the second sub-pixel 1012 emit different color light, then at least two of the first sub-pixels 1011 are electrically connected to a same secondary pixel driving circuit 1021, and at least two of the second sub-pixels 1012 are electrically connected to a same secondary pixel driving circuit 1021.

It can be understood that a shape of the sub-pixel 101 in the present application is not limited to rectangular, but can be one of circular, diamond, polygonal, or elliptical, or their combination. The display panel 100 may include a plurality of light-transmitting display regions 100a, which will not be described here.

Please continue referring to FIG. 2A to FIG. 2C, the orthographic projection of the first sub-electrode portion on the first sub-electrode layer 1031 has a second boundary 101a, and a distance between the second boundary 101a and the first boundary 103a of the first sub-electrode layer 1031 is greater than or equal to 0.5 microns.

Specifically, each of the first sub-electrode layer 1031 has a first boundary 103a. The first portion 104 and/or the second portion 105 has a second boundary 101a, respectively. A distance between each of the first boundaries 103a and the corresponding second boundary 101a is greater than or equal to 0.5 microns, so that in the top view, the first portion 104 and the second portion 105 are located within the first sub-electrode layer 1031 to ensure the structural integrity of the first sub-electrode 1061 and the second sub-electrode 1062.

Furthermore, the distance between the first boundary 103a and the second boundary 101a is equal to 0.8 microns, the influence to the light-transmitting display region 100a of the first sub-electrode layer 1031 can be reduced while the structural integrity of the first sub-electrode 1061 and the second sub-electrode 1062 can be ensured.

Furthermore, the distance between the first boundary 103a and the second boundary 101a can be determined according to a size of an opening (i.e., an effective area of a light-emitting layer 1063) 101b of the sub-pixel. Specifically, please refer to FIG. 2A, the first sub-electrode layer 1031 has a first side 1031a, a second side 1031b, a third side 1031c, and a fourth side 1031d; and an orthographic projection of the first sub-electrode portion on the first sub-electrode layer 1031 has a fifth side 200a, a sixth side 200b, a seventh side 200c, and an eighth side 200d. An orthographic projection of the opening 101b of the sub-pixel 101 on the first sub-electrode layer 1031 has a ninth side 201a, a tenth side 201b, a eleventh side 201c, and a twelfth side 201d. Wherein, the first side 1031a is adjacent to the second side 1031b and the fourth side 1031d, and the first side 1031a is opposite to the third side 1031c; the fifth side 200a is a side of the first sub-electrode portion close to the first side 1031a, the sixth side 200b is a side of the first sub-electrode portion close to the second side 1031b, the seventh side 200c is opposite to the fifth side 200a, the eighth side 200d is opposite to the sixth side 200b; the ninth side 201a is a side of the opening 101b close to the first side 1031a, the tenth side 201b is a side of the opening 101b close to the second side 1031b, the eleventh side 201c is opposite to the first side 1031a, and the twelfth side 201d is opposite to the second side 1031b.

A distance between the first side 1031a and the fifth side 200a can be less than or equal to ½ of a distance between the eleventh side 201c and the ninth side 201a; furthermore, a distance between the second side 1031b and the sixth side 200b can be less than or equal to ½ of a distance between the tenth side 201b and the twelfth side 201d, so as to prevent an oversize of the first sub-electrode layer 1031 which will take up the wiring space of the trace portion 1032.

It can be understood that the distance between the first side 1031a and the fifth side 200a can be equal to the distance between the second side 1031b and the sixth side 200b, and the distance between the second side 1031b and the sixth side 200b can be not equal to a distance between the third side 1031c and the seventh side 200c, which will not be described herein.

To improve electrical and optical properties of the first electrode, the first sub-electrode portion includes a reflecting layer located on the first sub-electrode layer 1031 and a transparent layer located on the reflecting layer, wherein an orthographic projection of the transparent layer on the first sub-electrode layer 1031 is located within the first boundary of the first sub-electrode layer 1031, and an orthographic projection of the reflecting layer on the transparent layer is located within a boundary of the transparent layer. Besides, the orthographic projection of the reflecting layer on the transparent layer can coincidences with the transparent layer, which will not be described in detail herein.

Specifically, please continue referring to FIG. 1C and FIG. 1D and FIG. 2A to FIG. 2C, the first portion 104 includes a first reflecting layer 1041 located on the first sub-electrode layer 1031 and a first transparent layer 1042 located on the first reflecting layer 1041; the second portion 105 includes a second reflecting layer 1051 located on the first sub-electrode layer 1031 and a second transparent layer 1052 located on the second reflecting layer 1051, wherein the first reflecting layer 1041, the first transparent layer 1042, and the first sub-electrode layer 1031 constitute the first sub-electrode 1061 of the first sub-pixel 1011, and the second reflecting layer 1051, the second transparent layer 1052, and the first sub-electrode layer 1031 constitute the second sub-electrode 1062 of the second sub-pixel 1012. In the top view, the first reflecting layer 1041 and the first transparent layer 1042, as well as the second reflecting layer 1051 and the second transparent layer 1052 are located within the first sub-electrode layer 103, and an orthographic projection of the first reflecting layer 1041 on the first transparent layer 1042 is located within a boundary of the first transparent layer 1042, and an orthographic projection of the second reflective layer 1051 on the second transparent layer 1052 is located within a boundary of the second transparent layer 1052.

Furthermore, a manufacturing material of the first electrode layer 103 is same as a manufacturing material of the transparent layer. Specifically, the manufacturing material of the first electrode layer 103 is same as a manufacturing material of the first transparent layer 1042 and a second transparent layer 1052. The manufacturing material of the first electrode layer 103 includes transparent conductive oxide; wherein the transparent conductive oxide includes indium tin oxide, zinc indium oxide, zinc gallium oxide, or zinc gallium indium oxide, etc. The manufacturing material of the first reflecting layer 1041 and the second reflecting layer 1051 includes one of Al, Ag, Ca, Au, or Cu to improve the optical properties of the light-transmitting display region 100a and the light transmittance of the light-transmitting display region 100a.

Please continue referring to FIG. 1A to FIG. 1D and FIG. 2A to FIG. 2C, a distribution density of the plurality of main sub-pixels 107 is the same as a distribution density of the plurality of sub-pixels 101, and an opening area of each of the main sub-pixels 107 is greater than an opening area of the opening 101b of the corresponding sub-pixel 101, to satisfy both the light transmittance and the display function of the light-transmitting display region 100a while reducing display difference between the light-transmitting display region 100a and the main display region 100b.

Furthermore, each of the first pixel unit includes a plurality of first pixels. Each of the first pixels includes a plurality of sub-pixels 101. The display panel 100 also includes a plurality of second pixel units located in the main display region 100b. Each of the second pixel units includes a plurality of second pixels. Each of the second pixels includes a plurality of main sub-pixels 107. Wherein, a number and an arrangement of the main sub-pixels 107 included in the second pixel are the same as a number and an arrangement of the sub-pixels 101 included in the first pixel.

Similarly, the display panel 100 also includes a plurality of third pixel units located in the transition display area 100c. Each of the third pixel units includes a plurality of third pixels. Each of the third pixels includes a plurality of transition area sub-pixels. Wherein, a number and an arrangement of the transition area sub-pixels included in the third pixel are the same as the number and the arrangement of the sub-pixels 101 included in the first pixel.

Furthermore, the number and the arrangement of the sub-pixels which emit a same color in the first pixel, the second pixel, and the third pixel are the same. Specifically, a number and an arrangement of the main sub-pixels emitting red light in the second pixel, a number and an arrangement of the transition area sub-pixels emitting red light in the third pixel, and a number and an arrangement of the sub-pixels in the first pixel are the same. Similarly, configurations of the sub-pixels emitting light of other colors in the corresponding pixels can be obtained, which will not be described herein. Wherein, luminous colors of the plurality of sub-pixels 101, the plurality of transition area sub-pixels and the plurality of main sub-pixels 107 include red, green, blue, white, etc.

Please continue referring to FIG. 1B to FIG. 1D, the display panel 100 also includes: a first trace layer 1081 located under the first electrode layer 103, wherein the first trace layer 1081 is electrically connected to the first electrode layer 103; a second trace layer 1082 located under the first trace layer 1081, wherein the second trace layer 1082 is electrically connected between the first trace layer 1082 and the secondary pixel driving circuit 1021, and a plurality of sub-pixels 101 are electrically connected to the secondary pixel driving circuit 1021 through the first trace layer 1081 and the second trace layer 1082 arranged in different layers, so as to increase the light transmission area of the light-transmitting display region 100a and improve the light transmittance of the light-transmitting display region 100a. Wherein, the first trace layer 1081 can be electrically connected to the first sub-electrode layer 1031, and the electrically connection between the plurality of the first sub-electrode layers 1031 and the first trace layer 1081 can be realized through the first sub-electrode layers 1031 and the trace portions 1032 disposed among the first sub-electrode layers 1031. Besides, the first trace layer 1081 can be electrically connected to the trace portion 1032, so that the electrically connection between the plurality of the first sub-electrode layers 1031 and the first trace layer 1081 can be realized through the trace portions 1032.

It can be understood that under the condition that the wiring space allows, only the first trace layer 1081 is configured to electrically connect the secondary pixel driving circuit 1021 and the sub-pixel 101 in the display panel 100, as shown in FIG. 1C. Referring to FIG. 1B, the display panel 100 may include a plurality of traces 108. The traces 108 include the first trace layer 1081 and the second trace layer 1082 to electrically connect the sub-pixels 101 and the secondary pixel driving circuits 1021.

It can be understood that the second pixel unit and the third pixel unit can also include the first sub-electrode layer 1031 and the electrode portion 200. Structures of the first sub-electrode layer 1031 and the electrode portion 200 located in the main display region 100b and the transition display area 100c can be designed with reference to the structure of the light-transmitting display region 100a, that is, each of the main pixels 107 includes a first main electrode. The first main electrode includes the first-sub electrode layer 1031 and the electrode portion 200 located on the first sub-electrode layer 1031 and electrically connected to the first sub-electrode layer 1031. Similarly, each of the transition area sub-pixels includes a first transition electrode. The first transition electrode includes the first sub-electrode layer 1031 and the electrode portion 200 located on the first sub electrode layer 1031 and electrically connected to the first sub electrode layer 1031.

Furthermore, the main display region 100*b* also includes a third trace layer 1083. The third trace layer 1083 is electrically connected to the main sub-pixel 107 and the main pixel driving circuit 1022. Since the requirement to light transmittance in the main display region 100*b* is lower than that of the light-transmitting display region 100*a*, the manufacturing material of the third trace layer 1083 can be different from the manufacturing material of the first trace layer 1081 and the manufacturing material of the second trace layer 1082. Namely, a light transmittance of the third trace layer 1083 can be less than or equal to a light transmittance of the first trace layer 1081 and a light transmittance of the second trace layer 1082. Specifically, the manufacturing material of the third trace layer 1083 includes metal material (e.g. Ag, Cu, etc.), transparent conductive oxide (e.g. ITO etc.), and the manufacturing material of the first trace layer 1081 and the manufacturing material of the second trace layer 1082 includes transparent conductive oxide.

Furthermore, the display panel also includes a substrate 110. The substrate 110 includes a rigid substrate and a flexible substrate; furthermore, the manufacturing material of the substrate 110 include glass, quartz, ceramics, plastics or polymer resins etc., and the polymer resins include at least one of polyethersulfone, polyacrylate, polyarylate, polyetherimide, polyethylene naphthalate and polyethylene terephthalate alcohol ester, polyphenylene sulfide, polyallyl ester, polyimide, polycarbonate, cellulose triacetate, or cellulose acetate propionate.

The secondary pixel driving circuits 1021 and the main pixel driving circuits 1022 are located on the substrate 110. Both the secondary pixel driving circuit 1021 and the main pixel driving circuit 1022 include a plurality of transistors. Furthermore, the plurality of transistors include a field effect transistor. Specifically, the plurality of transistors includes a thin film transistor. The plurality of transistors include at least one of oxide transistor, or silicon transistor.

The display panel 100 further includes: a pixel definition layer 109 located on the electrode portion 200 and the trace portion 1032; a light-emitting layer 1063 located in a pixel definition area of the pixel definition layer 109; and a second electrode 1064 located on the light-emitting layer 1063, and the pixel definition layer 109. Wherein, each of the sub-pixels 101 includes the first electrode, the light-emitting layer 1063, and the second electrode 1064. Specifically, the pixel definition layer 109 is located on the first portion 104, the second portion 105, and the trace portion 1032; the first sub-pixel 1011 includes the first sub-electrode 1061, the light-emitting layer 1063, and the second electrode 1064, and the second sub-pixel 1012 includes the second sub-electrode 1062, the light-emitting layer 1063, and the second electrode 1064.

Furthermore, the light-emitting layer 1063 also includes at least one of fluorescent materials, quantum dot materials, or perovskite materials, etc. The sub-pixel 101 includes at least one of organic light emitting diode, micro light emitting diode, or a sub-millimeter light emitting diode.

Furthermore, the display panel 100 also includes insulating layers 111. The insulating layers 111 are located between the first trace layer 1081 and the second trace layer 1082, and between the first trace layer 1081 and the first electrode layer 103, so as to space the first electrode layer 103, the first trace layer 1081, and the second trace layer 1082.

In addition, the display panel 100 also includes an encapsulation layer, a buffer layer, a color film layer, etc., which are not shown.

Figure 3A:
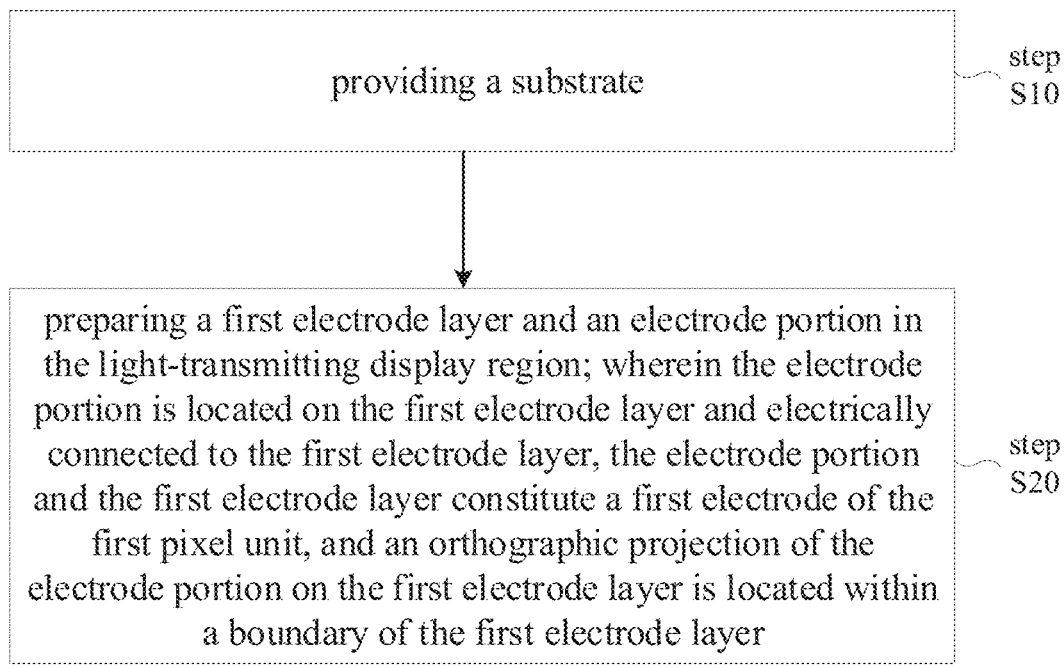
FIG. 3A to FIG. 3C are flow charts of manufacturing of the display panel provided by embodiments of present application.
Figure 3B:
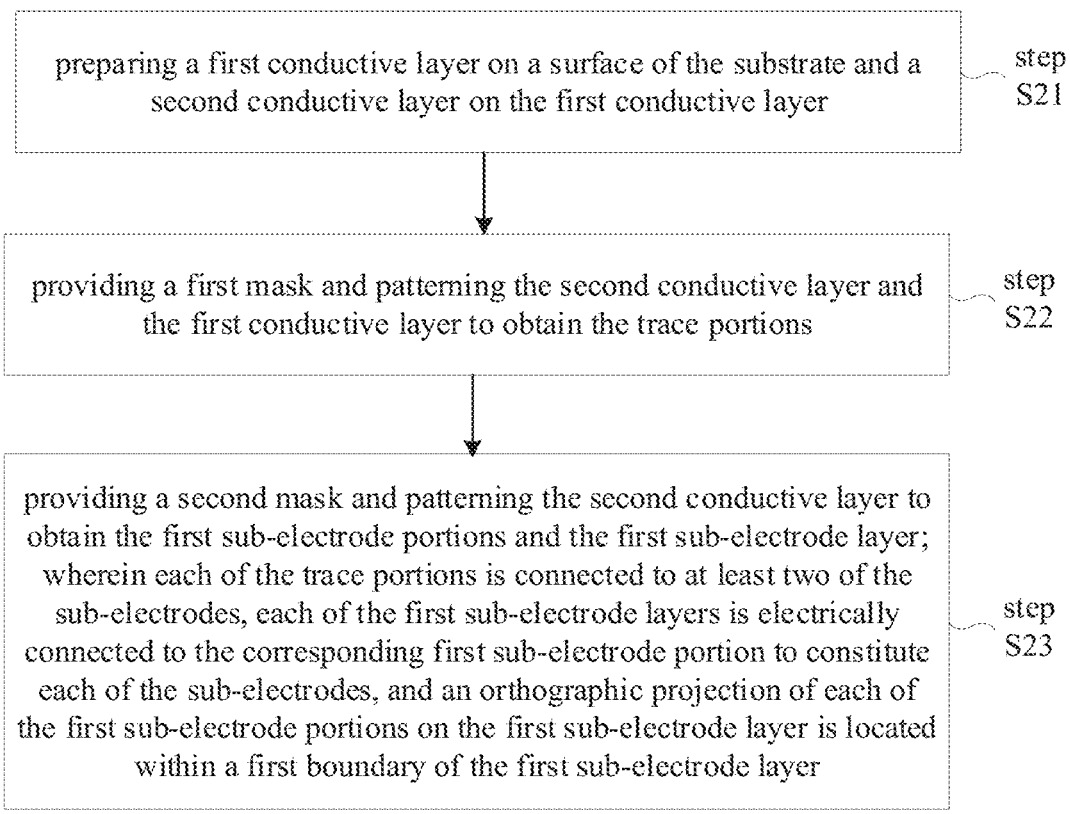
Figure 3C:
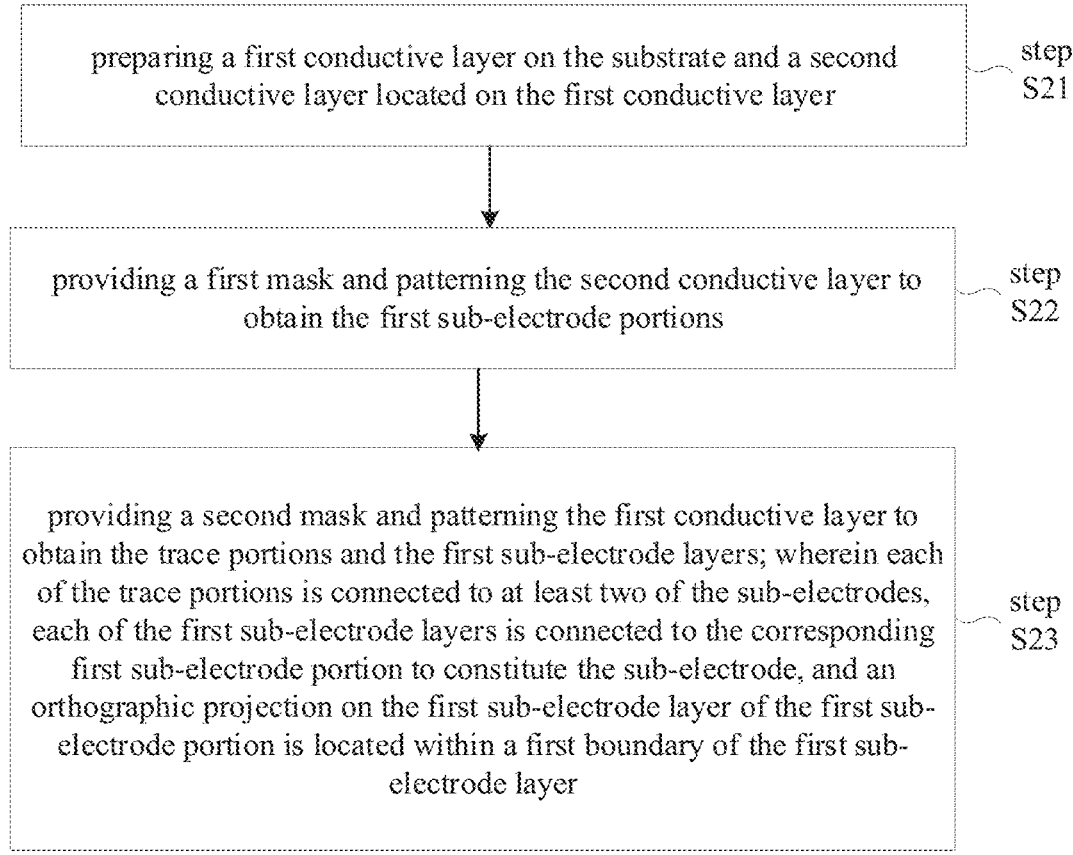

Please continue referring to FIG. 3A to FIG. 3C. FIG. 3A to FIG. 3C are flow charts of manufacturing of the display panel provided by embodiments of present application. As shown in FIG. 4A to FIG. 4G, FIG. 4A to FIG. 4G are schematic diagrams of manufacturing processes of the display panel provided by embodiments of the present application.

Figure 4A:
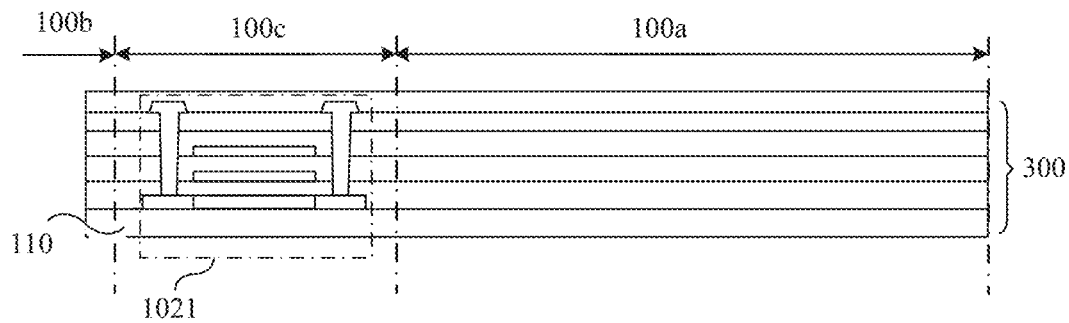
FIG. 4A to FIG. 4G are schematic diagrams of manufacturing processes of the display panel provided by embodiments of the present application.

A manufacturing method of a display panel is also provided by the present application. The display panel includes a light-transmitting display region 100*a* and a main display region 100*b* located around the light-transmitting display region 100*a*. The light-transmitting display region 100*a* includes a plurality of first pixel units, the manufacturing method includes following steps:

Step S10: providing a substrate 300, the substrate 300 includes a secondary pixel driving circuit 1021 as shown in FIG. 4A.

Step S20: preparing a first electrode layer 103 and an electrode portion 200 in the light-transmitting display region 100*a*.

Wherein, the electrode portion 200 is located on the first electrode layer 103 and electrically connected to the first electrode layer 103, the electrode portion 200 and the first electrode layer 103 constitute a first electrode of the first pixel unit, and an orthographic projection of the electrode portion 200 on the first electrode layer 103 is located within a boundary of the first electrode layer 103.

Furthermore, the first electrode includes a plurality of sub-electrodes; the first electrode layer 103 includes a plurality of first sub-electrode layer 1031 and a plurality of trace portions 1032 located among the first sub-electrode layers 1031; the electrode portion 200 includes a plurality of first sub-electrodes each corresponding to one of the plurality of first sub-electrode layers 1031. The step S20 further includes:

Step S21: preparing a first conductive layer 301 on a surface of the substrate 300 and a second conductive layer 302 on the first conductive layer 301, Step S22: providing a first mask 303 and patterning the second conductive layer 302 and the first conductive layer 301 to obtain the trace portions 1032, Step S23: providing a second mask 304, and patterning the second conductive layer 302 to obtain a first sub-electrode portion and the first sub-electrode layer 1031; wherein each of the trace portions 1032 are connected to at least two of the sub-electrodes, each of the first sub-electrode layer 1031 is electrically connected to the corresponding first sub-electrode portion to constitute each of the sub-electrodes, and an orthographic projection of each of the first sub-electrode portions on the corresponding first sub-electrode layer 1031 is located within a first boundary of the first sub-electrode layer 1031.

Specifically, please refer to FIG. 4A to FIG. 4G, each of the first pixel units includes a plurality of sub-pixels 101, the plurality of sub-pixels 101 includes a first sub-pixel 1011 and a second sub-pixel 1012. The plurality of sub-electrodes include a first sub-electrode and a second sub-electrode. The plurality of the first sub-electrode portions include a first portion 104 and a second portion 105. Wherein, the first sub-pixel 1011 includes the first sub-electrode, and the second sub-pixel includes the second sub-electrode. The first sub-electrode of the first sub-pixel 1011 is consisted of the first sub-electrode layer 1031 electrically connected to the secondary pixel driving circuit 1021, the first portion 104 located on the first sub-electrode layer 1031 and electrically connected to the first sub-electrode layer 1031. The second sub-electrode of the second sub-pixel 1012 is consisted of the first sub-electrode layer 1031, the second portion 105 located on the first sub-electrode layer 1031 and electrically connected to the first sub-electrode layer 1031. The first portion 104 and the second portion 105 are disposed at an interval. In the top view, both the first portion 104 and the second portion 105 are disposed within the first sub-electrode layer 1031. Please continue referring to FIG. 4B to FIG. 4D, and FIG. 4F, the step S20 further includes:

Step S21: preparing a first conductive layer 301 on the substrate 300 and a second conductive layer 302 located on the first conductive layer 301.

Figure 4B:
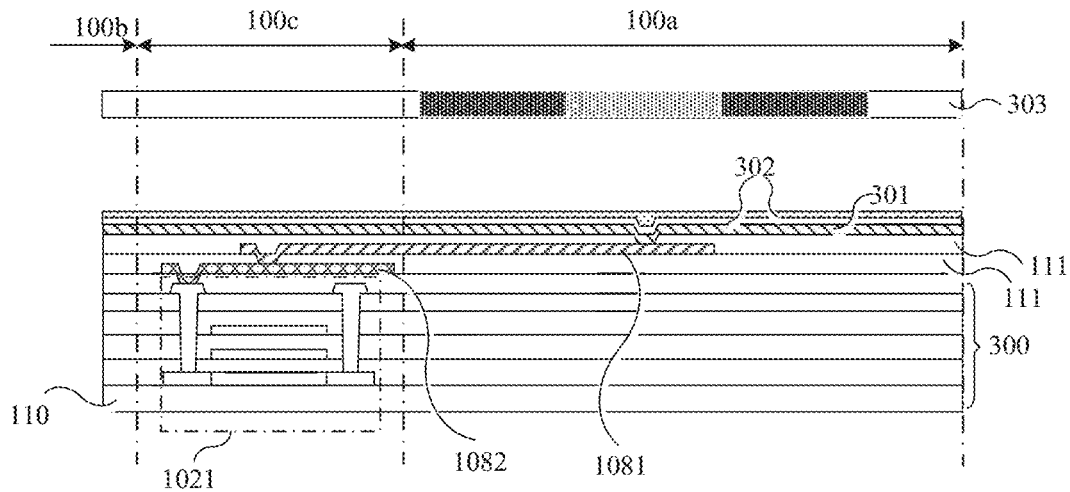
Figure 4C:
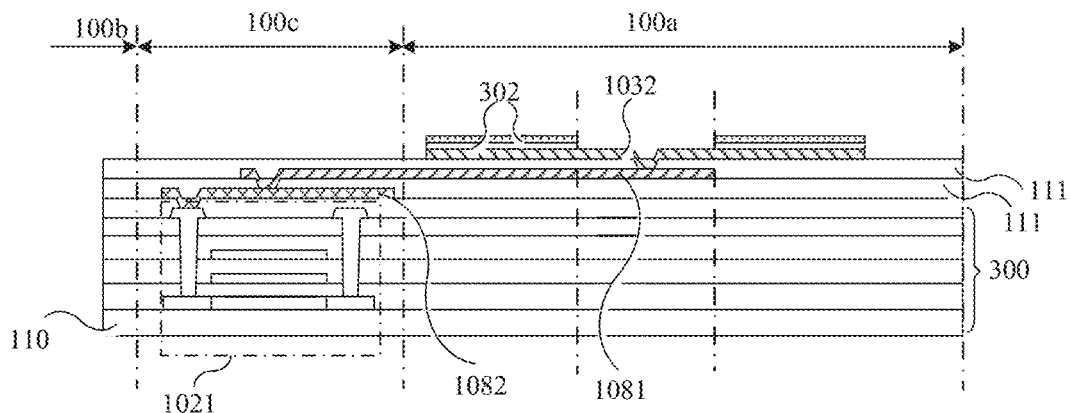

Step S22: providing a first mask 303 and patterning the second conductive layer 302 and the first conductive layer 301 to obtain the trace portions 1032, as shown in FIG. 4B to FIG. 4C.

Figure 4D:
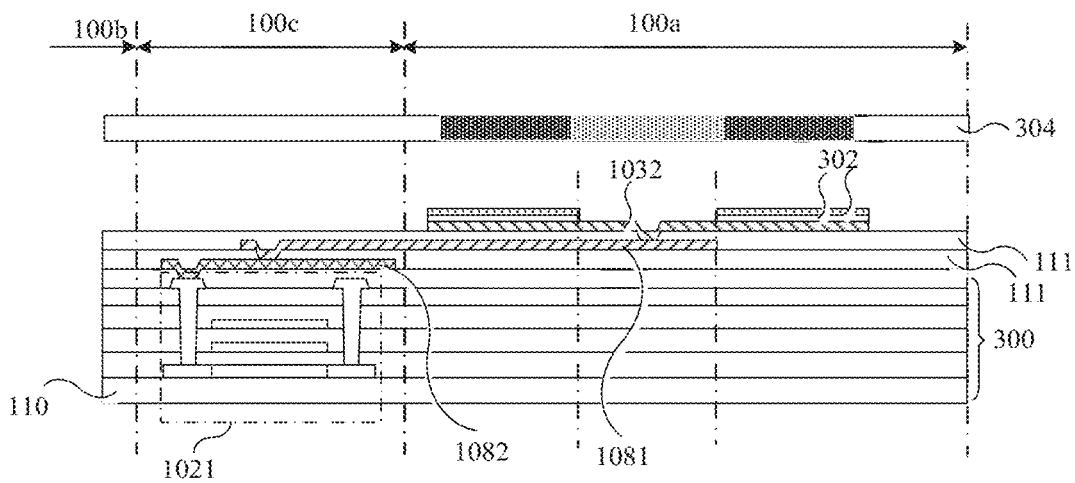
Figure 4E:
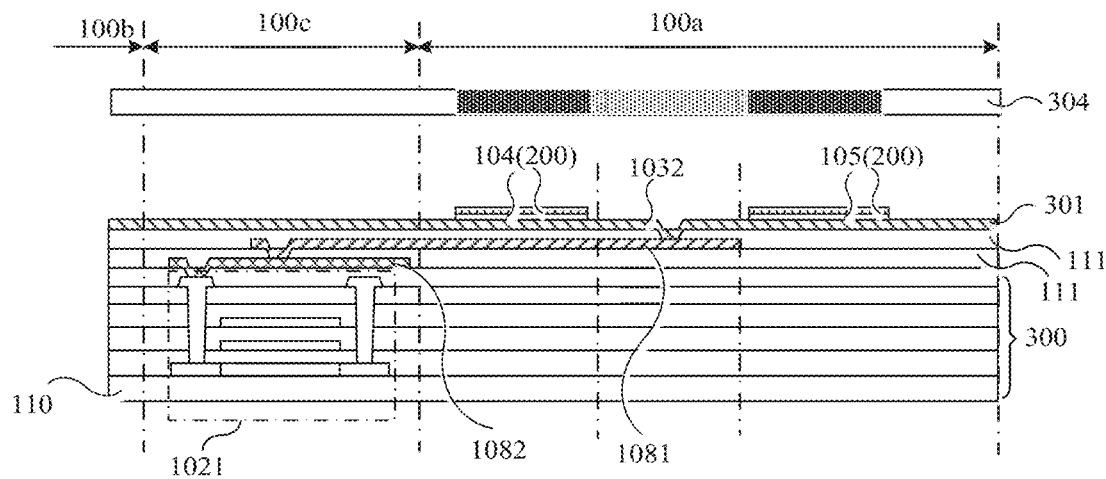
Figure 4F:
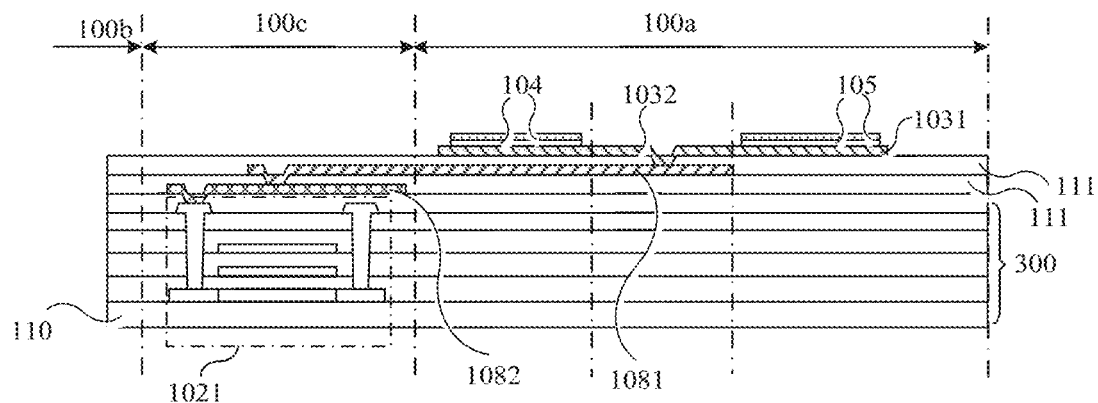
Figure 4G:
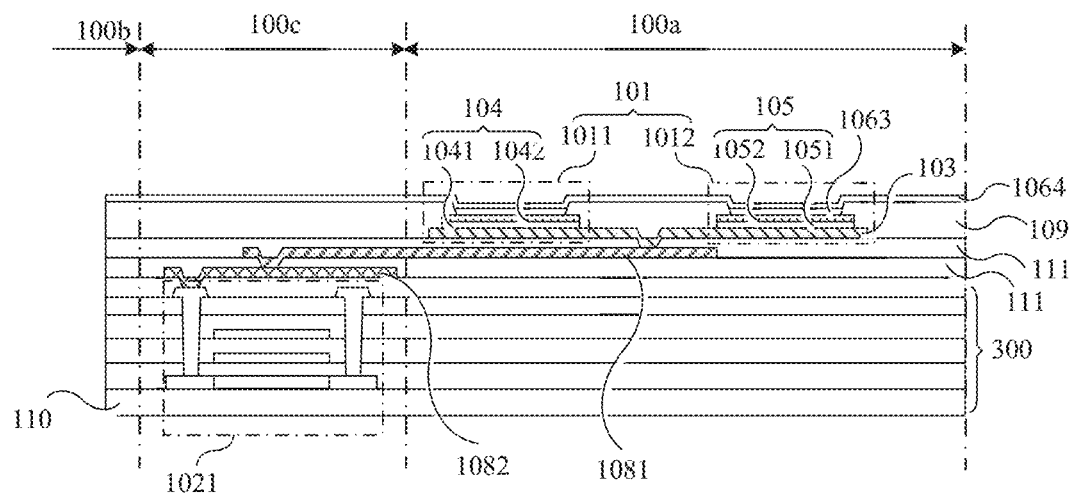

Step S23: providing a second mask 304 and patterning the second conductive layer 302 to obtain the first portion 104, the second portion 105, and the first sub-electrode layer 1031, as shown in FIG. 4D and FIG. 4F; wherein, the first portion 104 and the second portion 105 are located on two of the first sub-electrode layers 1031, respectively. In the top view, both the first portion 104 and the second portion 105 are disposed within the corresponding first sub-electrode layer 1031.

Photolithographic processes are used to pattern the second conductive layer 302 and the first conductive layer 301. Namely, a first photoresist layer is formed on the second conductive layer 302, and then exposure and development are performed to the second conductive layer 302 and the first conductive layer 301 using the first mask 303, and then etching is performed to the second conductive layer 302 and the first conductive layer 301 to form the trace portions 1032; then exposure and development are performed to the second conductive layer 302 and the first conductive layer 301 using the second mask 304, and etching is performed to the second conductive layer 302 and the first conductive layer 201 to form a plurality of the first sub-electrode portions (e.g. the first portion 104 and the second portion 105) and the plurality of first sub-electrode layers 1031 corresponding to the plurality of the first sub-electrode portions. The first sub-electrode portion and the first sub-electrode layer 103 are prepared by using two masks, two exposures, and two-step etching, which saves processes.

Similarly, the step S20 further includes:

Step S21: preparing a first conductive layer 301 on a surface of the substrate 300 and a second conductive layer 302 on the first conductive layer 301.

Step S22: providing a first mask 303 and patterning the second conductive layer 302 to obtain the first sub-electrode portions.

Step S23: providing a second mask 304 and patterning the first conductive layer 301 to obtain the trace portions 1032 and the first sub-electrode layers 1031; wherein each of the trace portions 1032 is connected to at least two of the sub-electrodes, each of the first sub-electrode layers 1031 is electrically connected to the corresponding first sub-electrode portion to constitute each of the sub-electrodes, an orthographic projection of each of the first sub-electrode portions on the corresponding first sub-electrode layer 1031 is located within a first boundary of the first sub-electrode layer 1031.

Specifically, please continue referring to FIG. 4B and FIG. 4E to FIG. 4F, the step S20 further includes:

Step S21: preparing a first conductive layer 301 on a surface of the substrate 300 and a second conductive layer 302 on the first conductive layer 301.

Step S22: providing a first mask 303, as shown in FIG. 4B, patterning the second conductive layer 302 to obtain the first portion 104 and the second portion 105.

Step S23: providing a second mask 304 and patterning the first conductive layer 301 to obtain the first sub-electrode layer 1031 and the trace portion 1032, as shown in FIG. 4E and FIG. 4F, wherein the first portion 104 and the second portion 105 are located on the first sub-electrode layer 1031, respectively. In the top view, both the first portion 104 and the second portion 105 are disposed within the corresponding first sub-electrode layer 1031.

Furthermore, the first sub-electrode portion includes a reflecting layer located on the first sub-electrode layer 1031 and a transparent layer located on the reflecting layer, wherein the manufacturing material of the first electrode layer 103 is the same as the manufacturing material of the transparent layer. Specifically, please continue referring to FIG. 4G, the first portion 104 includes a first reflecting layer 1041 located on the first sub-electrode layer 1031 and a first transparent layer 1042 on the first reflecting layer 1041; the second portion 105 includes a second reflecting layer 1051 located on the first-sub electrode layer 1031 and a second transparent layer 1052 located on the second reflecting layer 1051; wherein the manufacturing material of the first electrode layer 103 is the same as the manufacturing material of the first transparent layer 1042 and the second transparent layer 1042.

Wherein, the manufacturing material of the first electrode layer 103 includes transparent conductive oxide; the manufacturing material of the reflecting layer includes one or more of Al, Ag, Ca, Au, and Cu. Specifically, the manufacturing materials of the first-sub electrode layer 1031 and the trace portion 1032 include transparent conductive oxide; the manufacturing material of the first reflecting layer 1041 and the second reflecting layer 1051 includes one or more of Al, Ag, Ca, Au, and Cu.

Specifically, preparing a pixel definition layer 109, a light-emitting layer 1063 and a cathode 1064 on the first portion 104, the second portion 105 and the first electrode layer 103; the light-emitting layer 1063 is located in the pixel definition area of the pixel definition layer 109, the first sub-pixel 1011 includes the first sub-electrode 1061, the light-emitting layer 1063, and the cathode layer 1064. The second sub-pixel 1012 includes the second sub-electrode 1062, the light-emitting layer 1063, and the cathode layer 1064.

Please continue referring to FIG. 4A to FIG. 4G, the substrate 300 includes a base 110, and the secondary pixel driving circuit 1021 is located on the base 110. The display panel also includes a first trace layer 1081 and a second trace layer 1082 formed between the first electrode layer 103 and the secondary pixel driving circuit 1021. The first trace layer 1081 and the second trace layer 1082 are configured to electrically connecting the secondary pixel driving circuit 1021 and the sub-pixel 101.

Furthermore, the display panel 100 also includes insulating layers 111 formed between the first trace layer 1081 and the second trace layer 1082, and between the first trace layer 1081 and the first electrode layer 103. The first trace layer 1081 is electrically connected to the second trace layer 1082 and the first electrode layer 103 through a via provided in the insulating layers 111.

The display panel also includes a transition display area 100c located between the light-transmitting display region 100a and the main display region 100b. The secondary pixel driving circuit 1021 is located in the transition display area 100c to prevent influence on the light transmittance of the light-transmitting display region 100a.

The embodiments of the present application also provide a display device, including any one of the above-mentioned display panels and a sensor. The sensor directly faces the light-transmitting display region, so that the display device can realize functions of fingerprint identification, camera, light sensor, or distance sensor, etc.

Specifically, the sensor includes a fingerprint identification sensor, a camera, a structured light sensor, a time of flight sensor, a distance sensor, or a light sensor, etc., so that the sensor can collect signals through the light-transmitting display region, so that the display device can realize under-screen sensing such as under-screen fingerprint identification, under-screen camera, under-screen face recognition, or under-screen distance perception, etc.

Furthermore, the display device also includes a touch panel, and the touch panel is combined with the display panel in an in-cell way or an out-cell way to provide the display device with a touch function.

The display device includes a fixed terminal, i.e., a television, or a desktop computer, a mobile terminal i.e., a mobile phone, or a notebook computer, and a wearable device i.e., a bracelet, a virtual reality (VR) display device, or an augmented reality (AR) display device.

In the above embodiments, description of each embodiment has its own emphasis. For part with no detailed description in one embodiment, please refer to relevant description of other embodiments. The description of the above embodiments is only intended to help understand the technical schemes and core concepts of this disclosure. It is noted that those with ordinary skill in the technique field could make various modifications to technical schemes or equivalent replacements to part of the technical features described in embodiments above-mentioned, and these modifications and replacement don't make the substantial of corresponding technical schemes out of the scope of technical schemes of embodiments of the present application.

What is claimed is:

1. A display panel, comprising a light-transmitting display region and a main display region, wherein the light-transmitting display region comprises a plurality of first pixel units, and each of the first pixel units comprises:
    a first electrode layer; and
    an electrode portion, disposed on the first electrode layer and electrically connected to the first electrode layer, wherein the electrode portion and the first electrode layer constitute a first electrode of the first pixel unit; and
    wherein an orthographic projection of the electrode portion on the first electrode layer is located within a boundary of the first electrode layer, wherein the first electrode comprises a plurality of sub-electrodes, the first electrode layer comprises a plurality of first sub-electrode layers, the electrode portion comprises a plurality of first sub-electrode portions each corresponding to one of the plurality of first sub-electrode layers, each of the first sub-electrode layers is electrically connected to the corresponding first sub-electrode portion to constitute one of the sub-electrodes, and an orthographic projection of each of the first sub-electrode portions on the corresponding first sub-electrode layer is located within a first boundary of the first sub-electrode layer.

2. The display panel according to claim 1, wherein the first electrode layer further comprises a plurality of trace portions located among the first sub-electrode layers, and each of the trace portions connects at least two of the sub-electrodes.

3. The display panel according to claim 2, wherein each of the first pixel units comprises a plurality of sub-pixels, each of the sub-pixels comprises one of the sub-electrodes, wherein the sub-electrodes connected by a same one of the trace portions are located within a same one of the first pixel units, and the sub-pixels connected by a same one of the trace portions emit a same color light.

4. The display panel according to claim 2, wherein the display panel further comprises a transition display region located between the light-transmitting display region and the main display region and a secondary pixel driving circuit located in the transition display region, and the first electrode layer is electrically connected to the secondary pixel driving circuit.

5. The display panel of claim 4, further comprising:
    a first trace layer located under the first electrode layer, wherein the first trace layer is electrically connected to the trace portions; and
    a second trace layer located under the first trace layer, wherein the second trace layer is electrically connected between the first trace layer and the secondary pixel driving circuit.

6. The display panel of claim 5, wherein the main display region comprises a plurality of second pixel units, each of the second pixel units comprises: a first main electrode, a main pixel driving circuit, and a third trace layer electrically connected to the first main electrode and the main pixel driving circuit, and wherein the first main electrode comprises the first sub-electrode layers and the electrode portion, and a manufacturing material of the third trace layer is different from a manufacturing material of the first trace layer and a manufacturing material of the second trace layer.

7. The display panel of claim 6, wherein the manufacturing material of the third trace layer comprises metal material, and the manufacturing materials of the first trace layer and the second trace layer comprise transparent conductive oxide.

8. The display panel of claim 6, wherein a light transmittance of the third trace layer is less than or equal to a light transmittance of the first trace layer or a light transmittance of the second trace layer.

9. The display panel according to claim 1, wherein the orthographic projection of each of the first sub-electrode portions on the first sub-electrode layer has a second boundary, and a distance between the second boundary and the first boundary of the first sub-electrode layer is greater than or equal to 0.5 microns.

10. The display panel according to claim 9, wherein the distance between the second boundary and the first boundary of the first sub-electrode layer is 0.8 microns.

11. The display panel according to claim 1, wherein each of the first sub-electrode portions comprises a reflecting layer located on the first sub-electrode layer and a transparent layer located on the reflecting layer, wherein an orthographic projection of the transparent layer on the first sub-electrode layer is located within the first boundary of the first sub-electrode layer, and an orthographic projection of the reflecting layer on the transparent layer is located within a boundary of the transparent layer.

12. The display panel according to claim 11, wherein a manufacturing material of the first electrode layer is same as a manufacturing material of the transparent layer, the manufacturing material of the first electrode layer comprises transparent conductive oxide, and a manufacturing material of the reflecting layer comprises one or more of Al, Ag, Ca, Au, and Cu.

13. A display device comprising a display panel and a sensor, wherein the display panel comprises a light-transmitting display region and a main display region, and the sensor directly faces the light-transmitting display region, wherein the light-transmitting display region comprises a plurality of first pixel units, and each of the first pixel units comprises a first electrode layer and an electrode portion disposed on the first electrode layer and electrically connected to the first electrode layer, wherein the electrode portion and the first electrode layer constitute a first electrode of the first pixel unit, and wherein an orthographic projection of the electrode portion on the first electrode layer is located within a boundary of the first electrode layer, wherein the first electrode comprises a plurality of sub-electrodes, the first electrode layer comprises a plurality of first sub-electrode layers, the electrode portion comprises a plurality of first sub-electrode portions each corresponding to one of the plurality of first sub-electrode layers, each of the first sub-electrode layers is electrically connected to the corresponding first sub-electrode portion to constitute one of the sub-electrodes, and an orthographic projection of each of the first sub-electrode portions on the corresponding first sub-electrode layer is located within a first boundary of the first sub-electrode layer.

14. The display device according to claim 13, wherein the first electrode layer further comprises a plurality of trace portions located among the first sub-electrode layers, and each of the trace portions connects at least two of the sub-electrodes.

15. The display device according to claim 14, wherein each of the first pixel units comprises a plurality of sub-pixels, each of the sub-pixels comprises one of the sub-electrodes, wherein the sub-electrodes connected by a same one of the trace portions are located within a same one of the first pixel units, and the sub-pixels connected by a same one of the trace portions emit a same color light.

16. The display device according to claim 13, wherein the orthographic projection of each of the first sub-electrode portions on the first sub-electrode layer has a second boundary, and a distance between the second boundary and the first boundary of the first sub-electrode layer is greater than or equal to 0.5 microns.

17. The display device according to claim 13, wherein the sensor comprises a fingerprint identification sensor, a camera, a structured light sensor, a time of flight sensor, a distance sensor, or a light sensor.

* * * * *